US011444123B2

(12) United States Patent
Beery et al.

(10) Patent No.: US 11,444,123 B2
(45) Date of Patent: Sep. 13, 2022

(54) SELECTOR TRANSISTOR WITH METAL REPLACEMENT GATE WORDLINE

(71) Applicant: Integrated Silicon Solution, (Cayman) Inc., Grand Cayman (KY)

(72) Inventors: Dafna Beery, Palo Alto, CA (US); Peter Cuevas, Los Gatos, CA (US); Amitay Levi, Cupertino, CA (US); Andrew J. Walker, Mountain View, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/898,234

(22) Filed: Jun. 10, 2020

(65) Prior Publication Data

US 2021/0391386 A1     Dec. 16, 2021

(51) Int. Cl.
*H01L 27/24* (2006.01)
*H01L 27/22* (2006.01)
(Continued)

(52) U.S. Cl.
CPC .... *H01L 27/2454* (2013.01); *H01L 21/02532* (2013.01); *H01L 21/02546* (2013.01); *H01L 21/02565* (2013.01); *H01L 21/02639* (2013.01); *H01L 21/28088* (2013.01); *H01L 21/28255* (2013.01); *H01L 21/443* (2013.01); *H01L 27/228* (2013.01); *H01L 29/16* (2013.01); *H01L 29/161* (2013.01); *H01L 29/20* (2013.01); *H01L 29/24* (2013.01); *H01L 29/4966* (2013.01); *H01L 29/66522* (2013.01);
(Continued)

(58) Field of Classification Search
CPC .............. H01L 27/2454; H01L 27/228; H01L 21/02532; H01L 21/02546; H01L 21/02565; H01L 21/02639; H01L 21/28088; H01L 21/28255; H01L 21/443; H01L 29/24; H01L 29/4966; H01L 29/66522; H01L 29/66545; H01L 29/66666; H01L 29/66969; H01L 29/7827
USPC ........................................................... 257/5
See application file for complete search history.

(56) References Cited

U.S. PATENT DOCUMENTS 6,734,482 B1   5/2004   Tran et al.
6,756,625 B2   6/2004   Brown
(Continued)

OTHER PUBLICATIONS

Chung et al., "Novel 4F2 DRAM Cell with Vertical Pillar Transistor(VPT)," IEEE, 2011, pp. 211-214.
(Continued)

*Primary Examiner* — Tong-Ho Kim

(57) ABSTRACT

A vertical transistor structure having a metal gate wordline. The vertical transistor structure can include an epitaxially grown semiconductor column surrounded by a thin gate dielectric layer. A gate structure can surround the semiconductor column and the gate dielectric layer. The device can include first and second dielectric layers and an electrically conductive metal layer located between the first and second dielectric layers. The electrically conductive metal of the gate structure can be tungsten (W). In addition, a thin layer of Ti or TiN can be formed between the metal gate layer and the first and second dielectric layers and the gate dielectric layer. The metal gate layer can be formed with or without the use of a sacrificial layer.

18 Claims, 22 Drawing Sheets

(51) Int. Cl.
    *H01L 29/78*     (2006.01)
    *H01L 29/16*     (2006.01)
    *H01L 29/161*     (2006.01)
    *H01L 29/20*     (2006.01)
    *H01L 29/24*     (2006.01)
    *H01L 29/49*     (2006.01)
    *H01L 21/02*     (2006.01)
    *H01L 21/28*     (2006.01)
    *H01L 21/443*     (2006.01)
    *H01L 29/66*     (2006.01)

(52) U.S. Cl.
    CPC .. *H01L 29/66545* (2013.01); *H01L 29/66666* (2013.01); *H01L 29/66969* (2013.01); *H01L 29/7827* (2013.01)

(56) References Cited

U.S. PATENT DOCUMENTS

| | | | | |
|---|---|---|---|---|
| 2012/0161094 | A1* | 6/2012 | Huo | H01L 27/249 257/4 |
| 2013/0168752 | A1* | 7/2013 | Kim | H01L 27/11582 257/314 |
| 2016/0211368 | A1* | 7/2016 | Chen | H01L 29/66666 |
| 2017/0250193 | A1* | 8/2017 | Huo | H01L 27/11582 |
| 2018/0269225 | A1* | 9/2018 | Huang | H01L 27/11582 |
| 2020/0066741 | A1* | 2/2020 | Wu | H01L 27/11565 |
| 2020/0127052 | A1* | 4/2020 | Walker | H01L 43/12 |
| 2021/0090626 | A1* | 3/2021 | Beery | H01L 21/02293 |

OTHER PUBLICATIONS

Fang et al., "Fully CMOS-Compatible 1T1R Integration of Vertical Nanopillar GAA Transistor and Oxide-Based RRAM Cell for High-Density Nonvolatile Memory Application," IEEE Transactions on Electron Devices, vol. 60, No. 3, Mar. 2013, pp. 1108-1113.
Beery et al., U.S. Appl. No. 16/555,150, filed Aug. 29, 2019.
Ong et al., U.S. Appl. No. 16/457,544, filed Jun. 28, 2019.

* cited by examiner

SELECTOR TRANSISTOR WITH METAL REPLACEMENT GATE WORDLINE

FIELD OF THE INVENTION

The present invention relates to semiconductor transistor circuitry and more particularly to a vertical transistor structure with a metal gate line.

BACKGROUND

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

In order to increase efficiency of memory devices, there is an effort to create smaller memory cells. DRAM memory cells can shrink in several ways. One way to decrease the size of a memory cell is to reduce the minimum feature size (F). This generally occurs through new and advanced lithography and etching techniques. Memory cells can also be decreased by designing a smaller memory cell.

U.S. Pat. No. 6,734,482 issued to Tran, et al., describes the use of a bit line buried within an isolation trench. The memory cell described in that patent is a $6F^2$ memory cell. A conductive strap connects the bit line to the active area (source) of a planar transistor which does not use a vertical pillar. However, these designs can take up more chip real estate.

Vertical transistor designs can be used to decrease chip real estate occupied by a memory cell transistor. An example of a memory cell with a vertical transistor is disclosed in U.S. Pat. No. 6,756,625, issued to Brown, the disclosure of which is incorporated by reference herein. In that patent, the digit line is directly connected to a pillar used in the vertical transistor. However, this can be difficult to integrate into the process flow of a DRAM memory cell. Therefore, additional methods of forming vertical transistors are desirable.

SUMMARY

The present invention provides a vertical transistor structure. The vertical transistor structure includes a semiconductor pillar structure that is surrounded at its side by a gate dielectric layer. A metal gate layer contacts the gate dielectric layer to provide a gate voltage.

The metal gate layer can be an electrically conductive metal and is preferably tungsten. The semiconductor pillar can have a doped source and drain formed at opposite ends thereof and can be connected at one end to a doped region of a semiconductor substrate. The doped portion of the semiconductor structure can be configured to function as a source line for providing a source voltage to the semiconductor pillar. The opposite end of the semiconductor pillar can be doped to form the drain region and in one embodiment can be electrically connected with a two terminal resistive memory element.

A bit line can be electrically connected with the two terminal resistive memory element at an end opposite the vertical transistor structure. In one embodiment, the two terminal resistive memory element can be a magnetic tunnel junction (MTJ) element, and more preferably can be a perpendicular magnetic tunnel junction element (pMTJ).

The present invention also provides a method for manufacturing a memory device. A first dielectric layer, sacrificial layer and second dielectric layer are formed on a semiconductor substrate. A plurality of semiconductor pillar structures are formed in the first and second dielectric layers and sacrificial layer so as to extend to the semiconductor substrate. The sacrificial layer is removed, and an electrically conductive metal is deposited in the space left by the removed sacrificial layer.

A thin gate dielectric layer can be formed at the side of the semiconductor pillar to surround the semiconductor pillar structure. The formation of the thin gate dielectric layer can be performed before the formation of the semiconductor pillar or after the sacrificial layer has been removed.

The sacrificial layer can be a nitride, and the electrically conductive metal can be tungsten. The sacrificial layer can be removed by a process such as wet etching after the formation of the semiconductor pillar, and the electrically conductive metal can be deposited by an isotropic deposition process such as atomic layer deposition or chemical vapor deposition or a combination of these methods. After depositing the electrically conductive metal, a masking and etching operation can be performed to form a series of wordlines.

In another method of forming the vertical transistor structure, a metal gate layer can be initially deposited directly over the first dielectric layer rather than employing a sacrificial layer. The second dielectric layer can be deposited over the metal gate layer, and an opening for forming the semiconductor pillar and surrounding gate dielectric can be formed through the structure, (e.g. through the first and second dielectric layers and the metal (e.g. tungsten) gate material).

A protective and adhesion layer, such as TiN can be deposited between the metal gate layer and the first and second dielectric layers, and may preferably also be deposited between the metal gate layer and the gate dielectric layer exposed at the side of the semiconductor pillar. The presence of the protective layer can be useful in preventing damage to or etching of the dielectric oxide layers during deposition of the metal (e.g. tungsten) gate material. In addition, the protective layer (e.g. TiN) can promotes adhesion of the dielectric layers with the metal gate layer.

These and other features and advantages of the invention will be apparent upon reading of the following detailed description of the embodiments taken in conjunction with the figures in which like reference numeral indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Semiconductor transistor structures have been used for many years as switching structures in integrated circuits. Some applications have resulted in unique performance requirements that cannot be realized using traditional semiconductor transistor designs. In addition, there is an ever-present push for greater circuit density that cannot be met using traditional semiconductor transistor design. An example of an application requiring unique performance parameters is in use with memory applications wherein a semiconductor transistor is used as a selector to drive a memory element. Such designs require increased current drive when in an "on" mode and also require very low leakage. In addition, there is a need for a transistor design that can provide increasingly dense transistor circuit design. One transistor design that shows promise in achieving these unique design requirements is vertical transistor design, wherein a transistor is formed as a semiconductor column formed on a semiconductor substrate.

Figure 1:
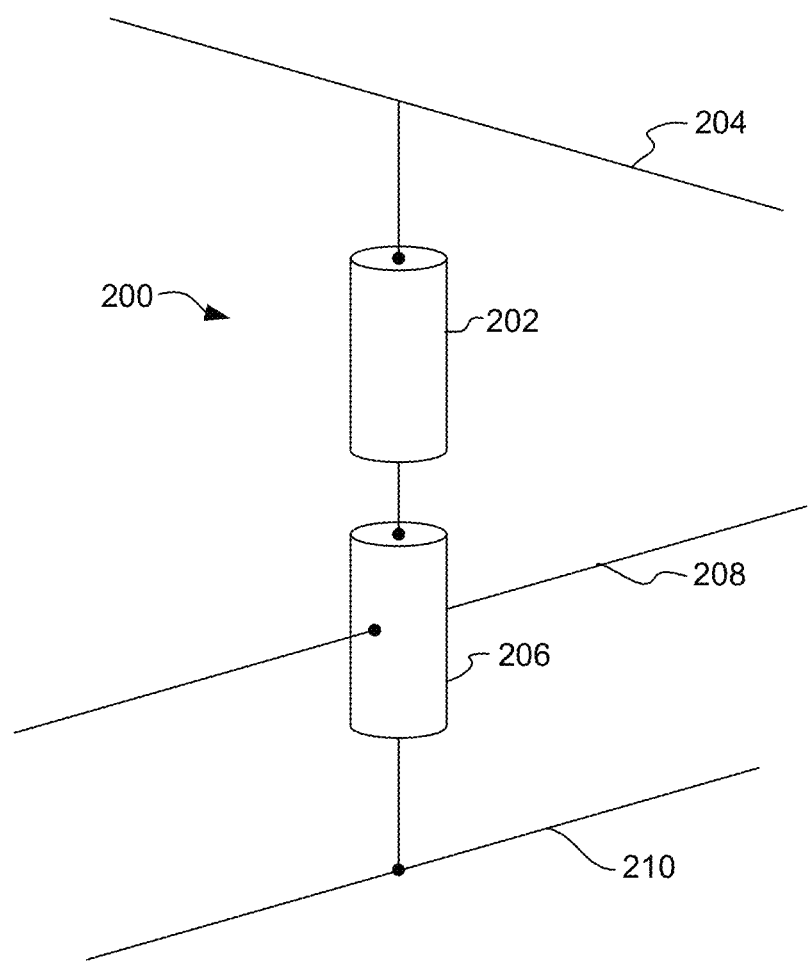
FIG. 1 is a schematic illustration of a two terminal resistive switching element connected with word and bit lines and connected with a source-line selector.

FIG. 1 is a schematic illustration of a memory cell 200 of a memory array, illustrating one example of an environment in which a vertical semiconductor transistor can be especially useful. The memory cell 200 includes a two terminal resistive memory element 202. The two terminal resistive memory element 202 can be a magnetic tunnel junction (MTJ) element, or could be some other type of two terminal resistive memory element such as, but not limited to: ReRAM; Correlated Electron RAM (CERAM); Conductive Bridge RAM (CBRAM); or memristor structures. ReRAM is a resistive switch which can be based on metal filaments such as silver in amorphous silicon. Other types of ReRAM include metal filaments in chalcogenide materials. In addition, a ReRAM element can be constructed using HfO with a titanium buffer layer. Various forms of tantalum oxide have also been used as an insulator between two metal electrodes. ReRAM can also be based on transition metal oxides (TMO) such as perovskite manganites and titanates. Correlated Electron RAM (CERAM) can be based on transition metal oxides such as perovskite manganites and titanates. Conductive Bridge RAM (CBRAM) can be formed using materials such as silver-doped germanium selenide glasses and copper-doped germanium sulfide electrolytes.

The two terminal resistive memory element 202 can be connected at one end to an electrically conductive bit line 204. The other end of the two terminal resistive memory element 202 can be connected with a selector 206. The selector 206 can be in the form of a vertical semiconductor transistor structure which will be described in greater detail herein below. The selector 206 is connected with a source line MO, which provides a source-line voltage to the selector 206 and therefore to the two terminal resistive memory element 202. A word-line 208 is electrically connected with the selector 206 in such a manner as to supply a gate voltage to the selector 206. When the word-line 208 applies a voltage to the selector 206, the selector becomes conductive, allowing a current to flow from the source-line 210 to the memory element 202. When voltage at the word-line 208 is removed, the selector 206 becomes resistive, thereby preventing the flow of current between the source-line 210 and the memory element 202.

Figure 2:
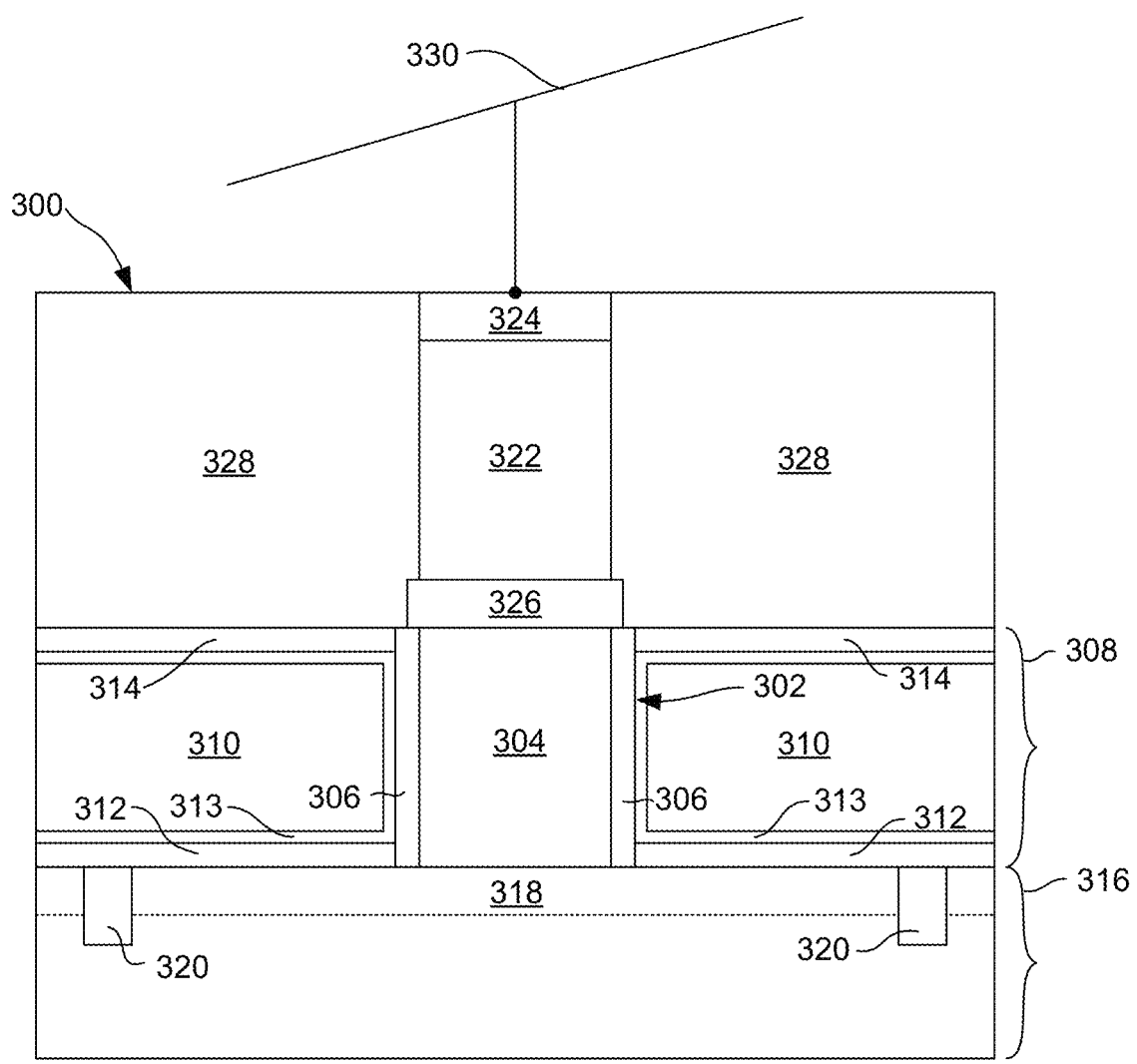
FIG. 2 is a side, cross-sectional view of a memory cell according to an embodiment.

FIG. 2 shows a side, cross-sectional view of a memory cell structure 300 according to one possible embodiment. The memory cell structure 300 include a vertical selector 302 that can include a semiconductor pillar 304 surrounded by a thin gate dielectric layer 306. The semiconductor pillar 304 can be formed of silicon, silicon-germanium, gallium-arsenide, indium-gallium-arsenide or gallium indium zinc oxide or combinations thereof. The semiconductor pillar 304 has lower and upper portions that are doped to form a source and drain so that the semiconductor pillar 304 forms a channel structure. A word-line structure 308 provides a gate voltage to the selector 302. The word-line structure 308 includes an electrically conductive gate material 310 and upper and lower dielectric insulation layers 312, 314. The electrically conductive gate material is an electrically conductive metal, preferably tungsten (W), tungsten nitride, or a combination of these, and is arranged such that the thin gate dielectric 306 separates the electrically conductive gate layer 310 from the semiconductor pillar 304. The upper and lower dielectric insulation layers 312, 314 can be an oxide or nitride such as SiOx or can be some other suitable dielectric material. Similarly, the thin gate dielectric layer 306 can be an electrically insulating material such as oxide such as SiOx or a nitride. The semiconductor pillar 304 can be a material such as silicon (Si), SiGe, Ge, etc.

A protective layer 313 may also be located so as to separate the metal gate layer 310 from the lower and upper dielectric layers 312, 314, as well as from the gate dielectric layer 306. The protective layer 313 can be constructed of a material such as TiN (in the case where the metal gate layer is tungsten) and serves to protect dielectric layers 312, 314 and gate dielectric 306 during deposition of the metal gate layer 310 as will be better understood upon reading the following discussion of a possible method for manufacturing a memory device. In addition, the protective layer 313 (preferably TiN) enhances adhesion between the metal gate layer 310 and the upper and lower dielectric layers 312, 314 and gate dielectric layer 306. The protective layer 313 can be a combination of Ti and TiN and can be formed by atomic layer deposition (ALD) or by physical vapor deposition by depositing Ti and introducing nitrogen gas ($N_2$) into the deposition chamber.

In the fabrication of semiconductor memory structures, one skilled in the art would most likely consider forming an electrically conductive gate layer, such as gate layer 310, of an electrically conductive doped polysilicon material. This is because the generally accepted semiconductor fabrication practices would lend themselves to easy deposition and processing of semiconductor material such as Si. However, forming the gate layer and word line 310 of an electrically conductive metal, preferably tungsten (W), significantly lowers the electrical resistance of the gate layer 310 compared with a material such as doped polysilicon. This reduced electrical resistance results in improved switching speed as well as other performance enhancements. The use of a metal gate layer 310 (i.e. tungsten) is made practical by novel fabrication process, which will be described herein below.

The selector transistor structure 302 and word-line structure 308 are formed on a semiconductor substrate 316. The semiconductor substrate 316 can include an upper doped portion 318 that can provide an electrically conductive source line. The substrate 316 may also include trench isolation structures 320, formed in the upper portion of the substrate to form individual source diffusion lines between the isolation structures 320. The trench isolation structures 320 can be formed of a dielectric material such as an oxide or nitride.

With continued reference to FIG. 2, in one embodiment, the memory cell 300 may also include a two terminal resistive memory element 322. The two terminal resistive memory element 322 can be a magnetic tunnel junction such as the perpendicular magnetic tunnel junction (pMTJ). Alternatively, the memory element 322 could be some other type of two terminal resistive memory element, such as: ReRAM; Correlated Electron RAM (CERAM); Conductive Bridge RAM (CBRAM); or memristor structures. ReRAM is a resistive switch which can be based on metal filaments such as silver in amorphous silicon. Other types of ReRAM include metal filaments in chalcogenide materials. In addition, a ReRAM element can be constructed using HfO with a titanium buffer layer. Various forms of tantalum oxide have also been used as an insulator between two metal electrodes. ReRAM can also be based on transition metal oxides (TMO) such as perovskite manganites and titanates. Correlated Electron RAM (CERAM) can be based on transition metal oxides such as perovskite manganites and titanates. Conductive Bridge RAM (CBRAM) can be formed using materials such as silver-doped germanium selenide glasses and copper-doped germanium sulfide electrolytes. In another embodiment, the memory cell structure 322 can be a capacitor. It should be pointed out, however, that the memory cell structure 300 is merely one example of a structure in which a vertical semiconductor structure 302 may be employed to great advantage. Many other situations exist in which a vertical transistor structure 302 having a metal gate structure 310 may be employed.

The memory element 322 can be connected with upper and lower electrodes, 324, 326. The lower electrode 326 can be arranged to electrically connect the memory element 322 with the semiconductor column 304. The upper electrode 324 can connect the opposite end of the memory element 322 with bit line circuitry 330. Areas surrounding the memory element 322 and upper and lower electrodes 324, 326 can be filled with a dielectric isolation material 328 such as an oxide or nitride.

Figure 3:
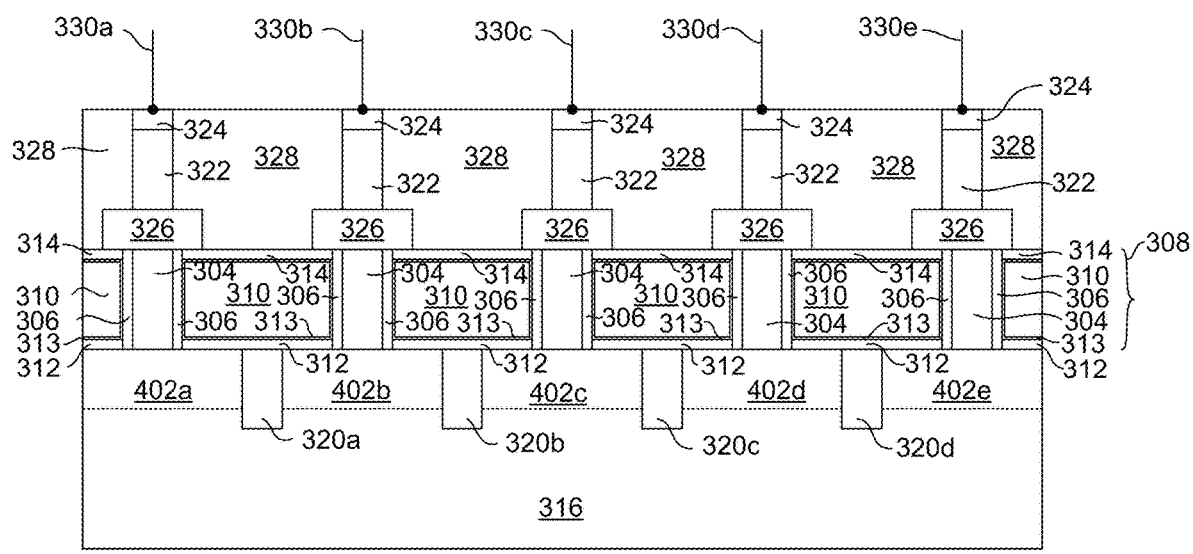
FIG. 3 is an enlarged view showing a plurality of memory cells according to an embodiment.

FIG. 3 is an enlarged cross-sectional view showing a plurality of memory cells connected with different bit lines 330a-e, and connected with a common word-line structure 308. As shown in FIG. 3, the memory cells 300 can also be connected with individual source diffusion lines 402a-e, that are separated by trench isolation structures 320a-d. In one embodiment, the source diffusion lines 402a-e and bit lines 330a-e can run in a direction perpendicular to the word-line structure 308 as shown in FIG. 3.

Figure 4:
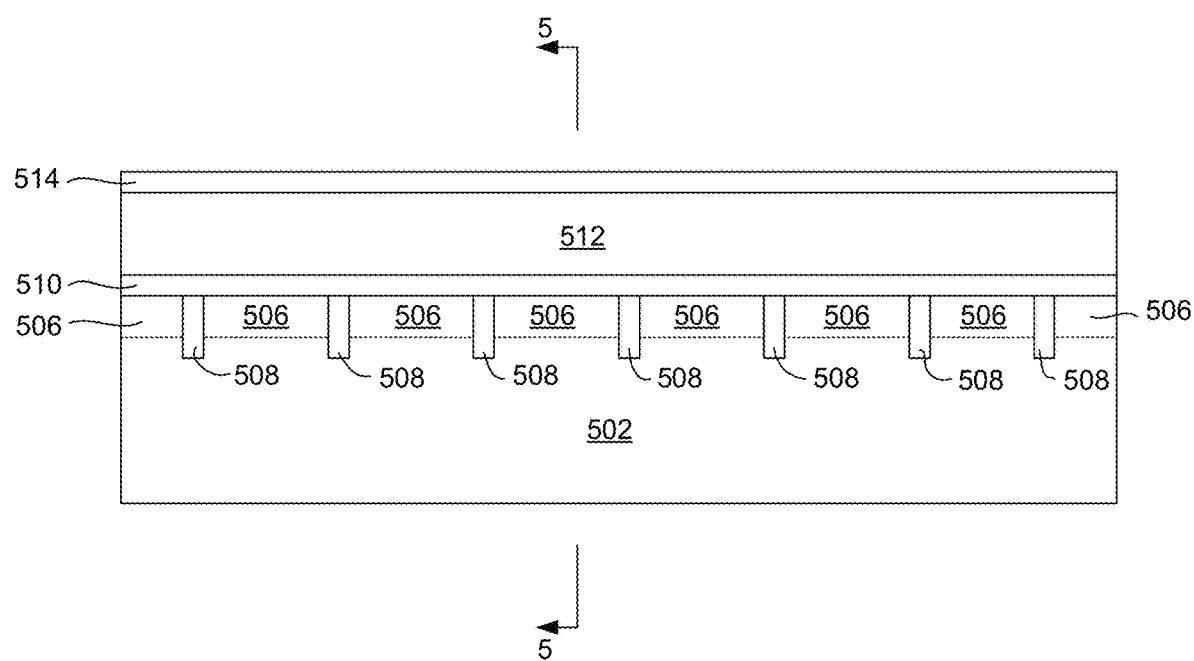
FIGS. 4-17 show a wafer in various intermediate stages of manufacture in order to illustrate a method of manufacturing a vertical transistor structure according to an embodiment.

FIGS. 4-17 show an example of a vertical transistor structure in various intermediate stages of manufacture in order to illustrate a method of manufacturing a memory array according to an embodiment. With particular reference to FIG. 4, a semiconductor substrate 502 is provided. An upper portion of the substrate 502 can be n+ doped such as with phosphorous or arsenic. This upper doped portion can be divided into source diffusion lines 506 by dielectric trench isolation structures 508.

A first dielectric layer 510 is deposited over the substrate 502 and source diffusion lines 506 and trench isolation structures 508. A sacrificial layer 512 is then deposited over the first dielectric 510. A second dielectric layer 514 is then deposited over the sacrificial nitride layer 512. The first and second dielectric layers 510, 514 are each preferably an oxide such as silicone dioxide. The sacrificial layer 512 can be a nitride such as silicon nitride (SiNx) and is deposited to a thickness that is equal to a desired thickness of an electrically conductive word line gate structure, as will be seen.

Figure 5:
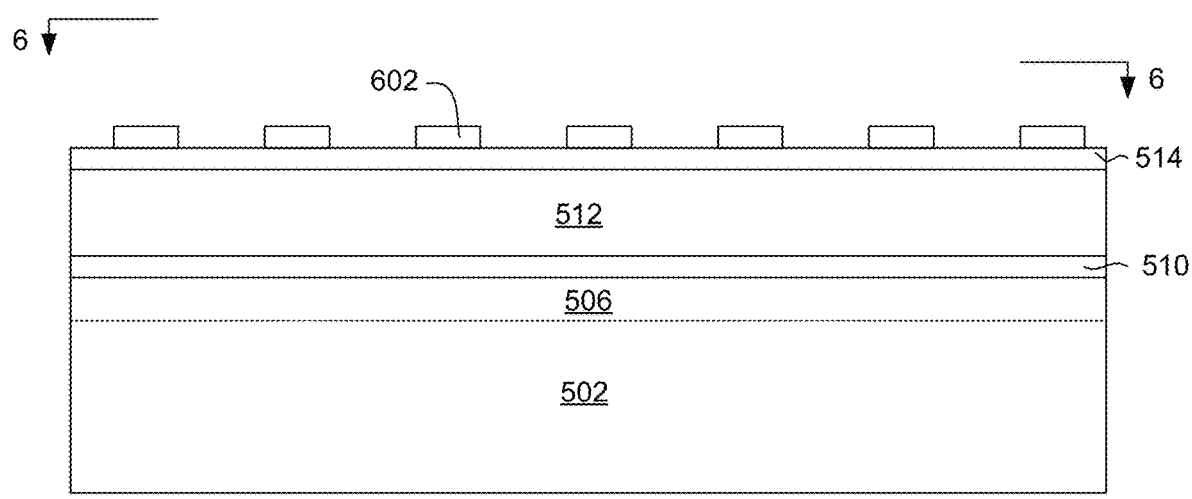
Figure 6:
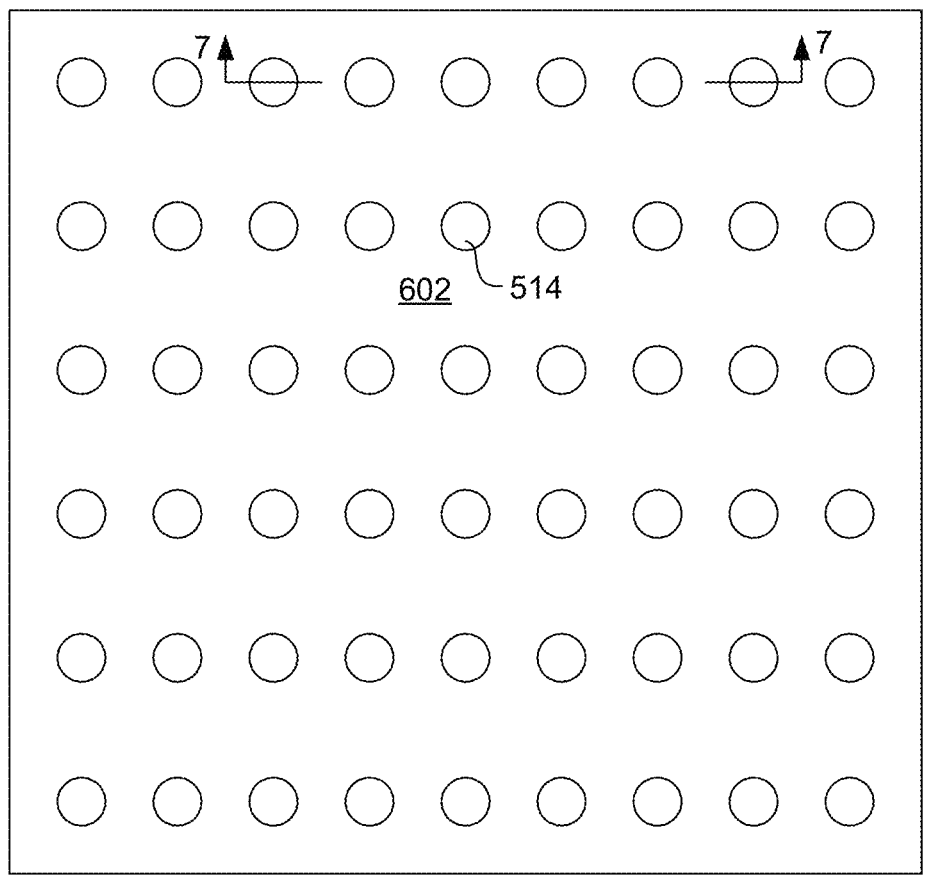

FIG. 5 shows a cross-sectional view as seen from line 5-5 of FIG. 4 along a plane parallel with a source diffusion line 506. As shown in FIG. 5, a mask structure 602 is formed over the second, upper dielectric layer 514. The mask structure 602 has openings that are configured to define a plurality of vertical selector devices. This can be seen more clearly with reference to FIG. 6, which shows a top down view as seen from line 6-6 of FIG. 5. In FIG. 6 it can be seen that the mask 602 can be configured with circular openings exposing the underlying second dielectric layer 514. While the mask openings are shown as being circular, this is by way of example. The openings in the mask 602 could have other shapes such as for example, oval, square or some other polygon.

Figure 7:
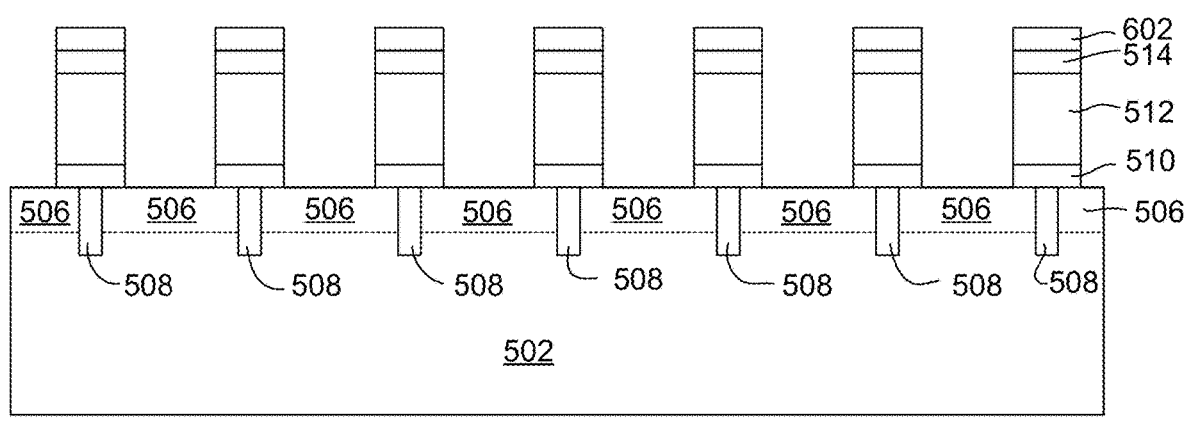

With reference now to FIG. 7, which shows a cross sectional view along a plane indicated by line 7-7 of FIG. 6, a material removal process such as reactive ion etching (RIE) is performed to remove regions of the layers 514, 512, 510, that are exposed through the openings in the mask 602. This material removal process can be continued until the substrate 506 has been reached.

Figure 8:
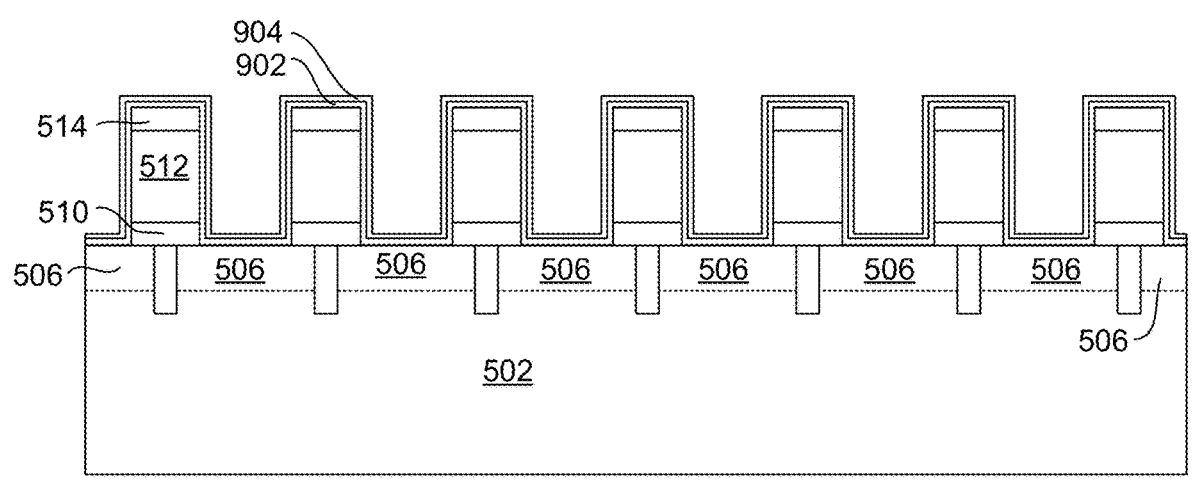

With reference now to FIG. 8, a thin gate dielectric layer 902 is deposited. The gate dielectric layer 902 can be an oxide such as silicon oxide. A protective layer 904 such as silicon can be deposited over the gate dielectric layer 902. The protective layer 904 can be provided to protect the gate dielectric layer 902 during various etching processes as will be seen.

Figure 9:
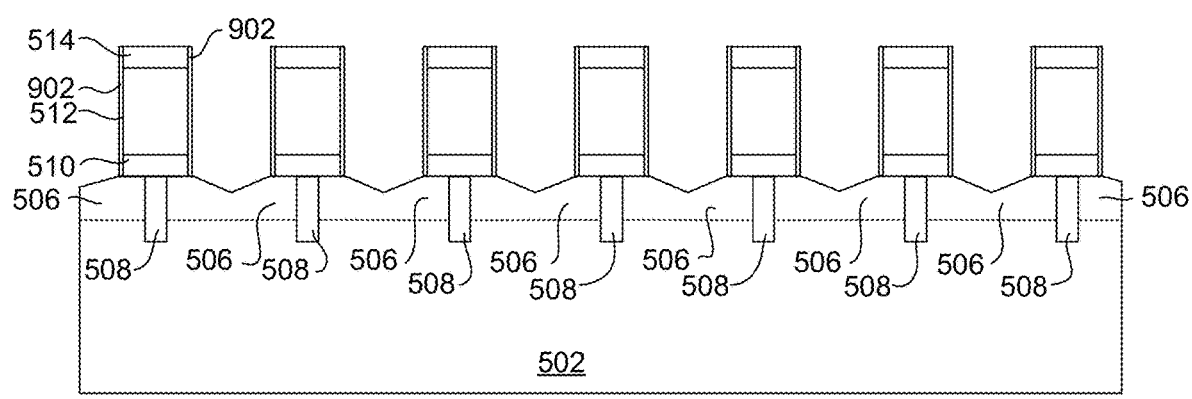

An anisotropic etching process such as ion beam etching is performed to open the bottom of the hole and only remove horizontally disposed portions of the gate dielectric layer 902 and protective layer 904. This is performed sufficiently to expose the underlying substrate 506. The protective layer 904 protects the gate dielectric layer 902 at the side walls of the hole openings during this anisotropic etching so as to preserve gate dielectric thickness. After the anisotropic etching has been performed, any protective layer 904 remaining on the gate dielectric sidewalls 902 can be removed by performing a selective isotropic material removal process such as reactive ion etching or wet etching using a process and/or chemistry chosen to preferentially remove the material of the protective layer 904, while leaving the remaining gate dielectric intact. This results in a structure as shown in FIG. 9, with a gate dielectric layer formed on the inside walls of the openings and coating the inside walls of the dielectric layers 510, 514 and sacrificial layer 512.

Further etching can be performed to remove any native oxide from the surface of the substrate 506 at the bottom of the openings. This etching process is performed to enable specific crystallographic growth of a semiconductor thereon. In addition, this etching process can be performed in such a manner to form a beveled recess as shown in FIG. 9.

Figure 10:
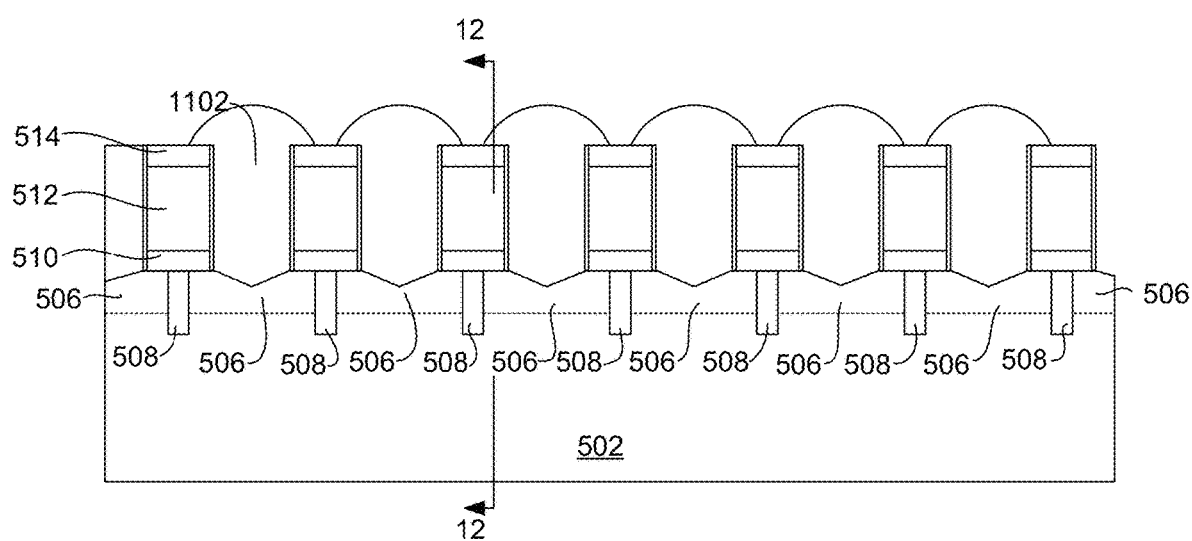

With the substrate etched to remove oxides, a semiconductor material is grown using selective epitaxial growth, thereby forming semiconductor pillars 1102 in the hole opening as shown in FIG. 10. These pillars 1102 can be of various shapes, such as but not limited to cylindrical, rectangular prism, etc. The semiconductor material 1102 can be silicon, silicon-germanium, gallium-arsenide, indium-gallium-arsenide or gallium indium zinc oxide or combinations thereof. The semiconductor can be grown until it extends out of the opening, forming a mushroom shape at the top of the opening. A chemical mechanical polishing process can be performed to remove any of the semiconductor pillar 1102 that extends out of the openings (i.e. above the second dielectric layer 514). The selective epitaxial growth of semiconductor material on substantially monocrystalline surface of the substrate 506, allows the semiconductor pillars to have a desired crystalline direction and structure that can be monocrystalline or nearly monocrystalline. In addition, the beveled or faceted shape of the etched substrate surface further promotes desirable properties in the semiconductor pillar 1102 grown thereon. This substantially monocrystalline structure of the semiconductor pillars minimizes electrical resistance in the selector structures when in an "on" state. This advantageously maximizes the amount of current that can be delivered to a memory element during writing as will be seen.

A high temperature treatment can be performed to drive dopants from the doped semiconductor substrate 506 into the bottom region of the semiconductor column 1102 to form a drain region at the top of the semiconductor column 1102. The upper portion of the semiconductor column 1102 can also be doped to form a drain region at the top of the semiconductor column 1102. This can be accomplished by depositing a layer of doped semiconductor material (e.g., doped polysilicon) on top of the wafer followed by high temperature treatment that drives the dopants into the top part of the semiconductor 1102. Following this a chemical mechanical polishing or etch-back process can be applied to remove the doped semiconductor material from the wafer surface. Alternatively, doped source and drain regions of the epitaxial grown column can be formed by in-situ implanting of the bottom and top regions during the epitaxial growth, followed by hat treatments. It should be pointed out that the term "pillar" or "column" as used herein is not limited to a particular shape, and could be a cylindrical pillar, rectangular prism, etc.

Figure 11:
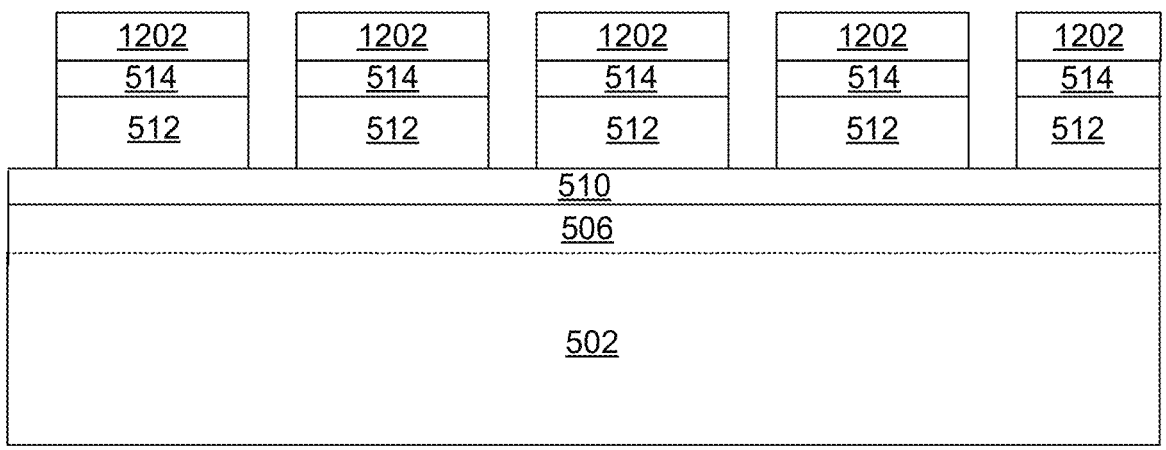

With reference now to FIG. 11, a hard mask structure 1202 is formed over the layers 510, 512, 514. The hard mask 1202, if used, is configured with openings such as trenches. An anisotropic material removal process such as reactive ion etching or ion beam etching is performed to remove the second dielectric layer 514, and optionally to also remove a portion of the sacrificial layer 512. The etching can be terminated when the bottom dielectric layer 510 has been reached, as shown in FIG. 11, or optionally could be performed to only remove the top (second) dielectric layer 514. Then, an isotropic etch is performed to remove the sacrificial nitride material 512. The sacrificial nitride layer 512 can be removed using a wet etch process, such as using hot phosphoric acid at a temperature of 120-160 degrees C. or about 140 degrees C. This wet etch is highly selective to removal of nitride over oxide, thereby allowing complete removal of all of the SiN sacrificial layer 512 from between the oxide layers 510, 514, without significantly removing the oxide layers 510, 514.

Figure 12:
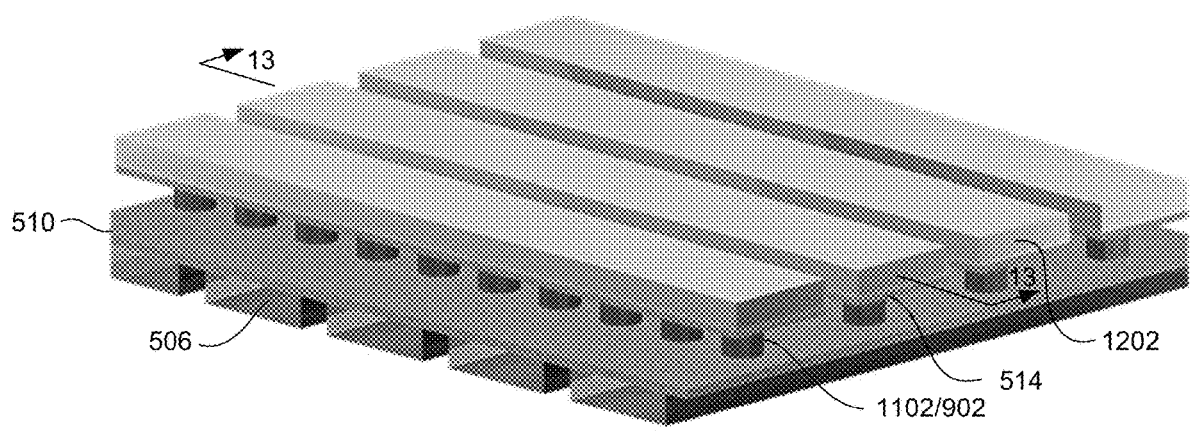
Figure 13:
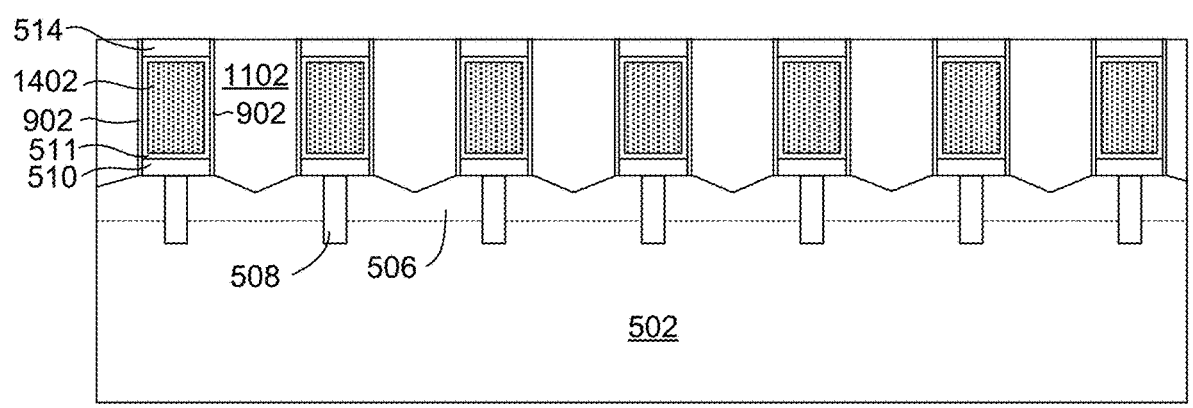

The resulting structure can be better understood with reference to FIG. 12, which shows a three-dimensional view of the structure with the sacrificial nitride layer 512 (FIG. 11) removed. As can be seen in FIG. 12, the upper dielectric layer 514 and hard mask structure 1202 (if used) are supported by the previously formed semiconductor columns 1102 and gate dielectric layers 902. FIG. 13 shows a cross sectional view as seen from line 13-13 of FIG. 12. The empty spaces left after removal of the sacrificial nitride layer are shown as shaded regions 1402.

Figure 14:
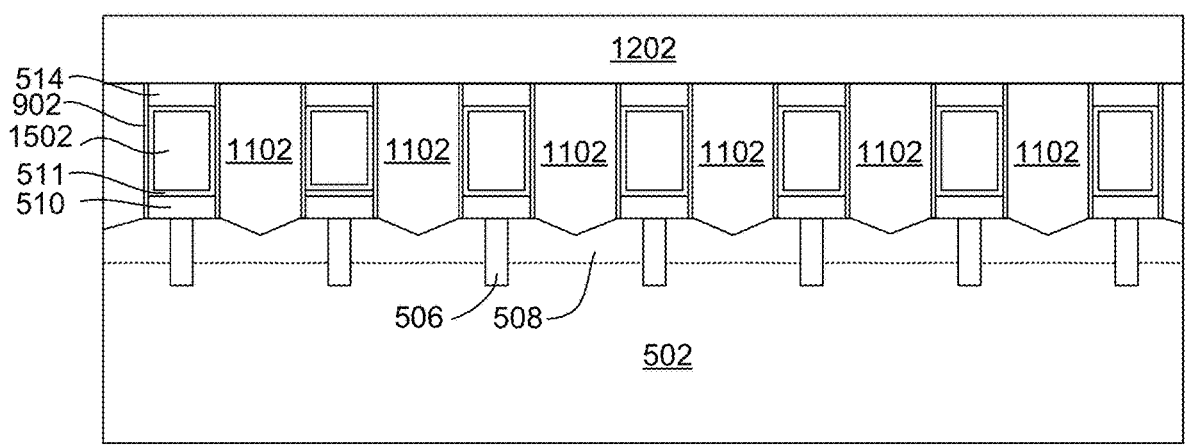

With the sacrificial nitride layer 512 removed, a protective and adhesion layer 511 is deposited. The protective layer 511 is preferably TiN (if tungsten will be used as the gate layer) and can be deposited by a conformal deposition process such as physical vapor deposition or atomic layer deposition. As can be seen in FIG. 13, the protective layer 511 coats the upper and lower dielectric layers 510, 514, as well as the gate dielectric layers 902. As shown in FIG. 14, after depositing the protective layer 511, a metal 1402 can be deposited to fill the remaining space. The deposited metal can be of various types of electrically conductive metal and is preferably tungsten (W), tungsten nitride, or a combination of these. Preferably, a chemical vapor deposition process can be used to deposit tungsten (W) 1502, or by atomic layer deposition followed by chemical vapor deposition. This deposition can be performed using $WF_6$ vapor. However, such use of $WF_6$ vapor for deposition of tungsten metal 1502 can etch the oxides of the upper and lower dielectric layers 510, 514 as well as the gate dielectric layers 902. The deposition of tungsten includes the use of $WF_6$ and $H_2$, the byproducts of which include hydrofluoric acid (HF), which attacks and etches silicon oxide. The presence of the protective layers 511 prevents such damage to the first and second oxide layers 510, 514 and gate dielectric layers 902 during the deposition of tungsten metal material 1502. In addition, the protective layer 511 advantageously enhances adhesion of the W gate layer 1402 with the dielectric layers 510, 514 and with the gate dielectric layer 902. To provide effective protection of the first and second dielectric dielectric layers 510, 514, and gate dielectric layer 902, the protective layer 511 preferably comprises TiN or Ti/TiN, and can have a thickness of only a few nanometers, such as 3-5 nm. The Ti or Ti/TiN layer 511 can be deposited by atomic layer deposition (ALD) or by physical vapor deposition using a Ti target, while introducing nitrogen gas ($N_2$) into the chamber. A chemical mechanical polishing process can then be performed to remove tungsten and Ti/TiN from the wafer surface. The hard mask 1202 (if used) can be removed or left intact.

Figure 15:
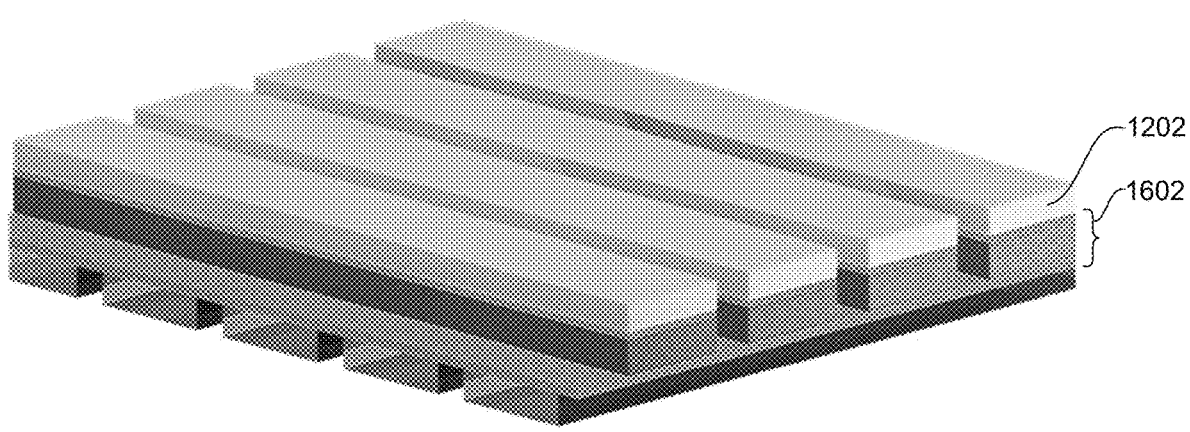

A material removal process such as anisotropic etching is performed to remove regions of the recently deposited metal 1502, to form word line structures 1602 as shown in three dimensions in FIG. 15. The previously formed hard mask 1202 can be used or a new hard mask can be formed before etching. A dielectric material 1604 such as silicon oxide (not shown in FIG. 15) can then be deposited to form isolation between the formed word lines, followed by a chemical mechanical polishing to remove excess dielectric material. The hard mask 1202 can then be removed (as shown in FIG. 16) or can be left intact if vias are to be formed to make electrical contact with the underlying selector structure.

Figure 16:
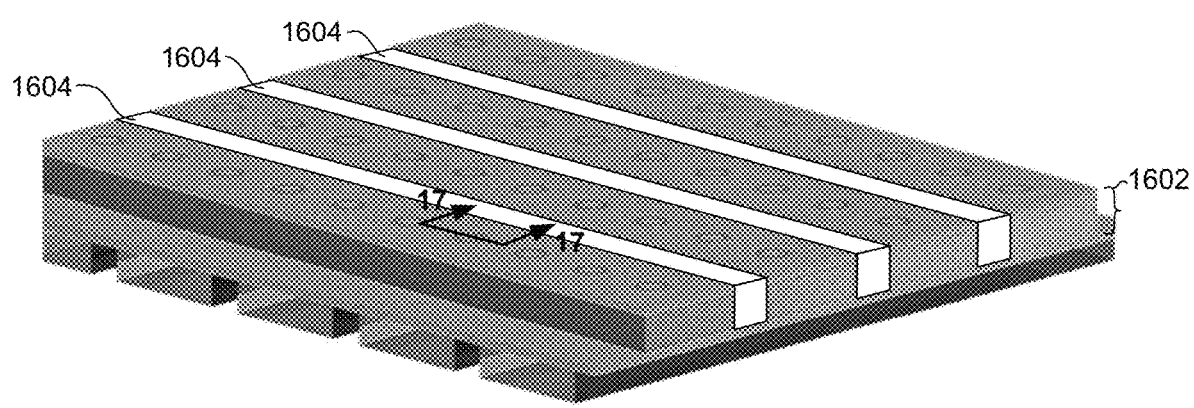
Figure 17:
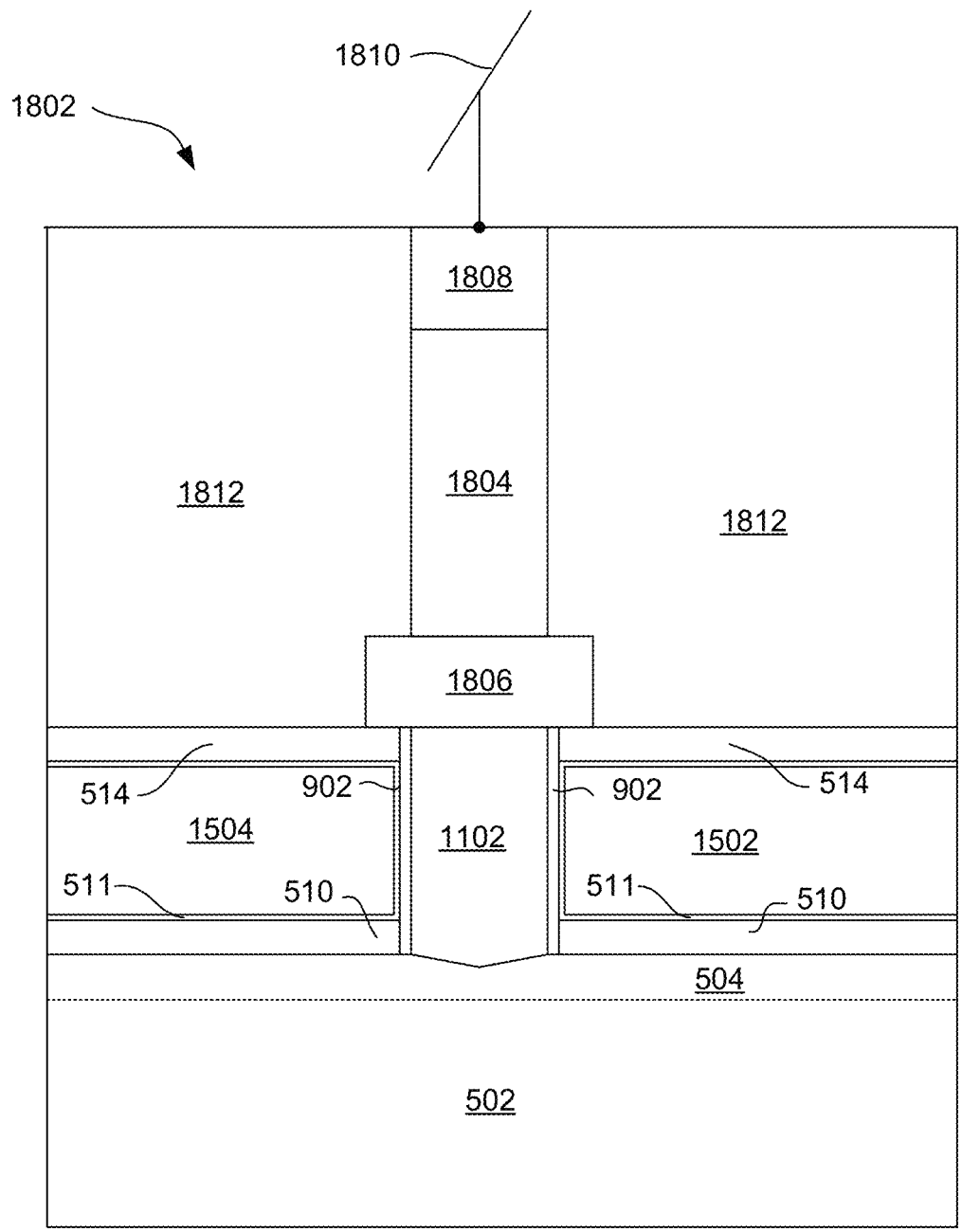

FIG. 17, shows a cross sectional view of an individual memory cell 1802 as seen from line 17-17 of FIG. 16 with the addition of the memory cell 1802. As shown in FIG. 17, a two terminal resistive memory element 1804 can be formed over the semiconductor column. A first electrically conductive electrode or via 1806 can also be formed between the memory element 1804 and the semiconductor column 1102 to electrically connect the memory element 1804 with the semiconductor column 1102. A second (upper) electrically conductive electrode 1808 can also be formed over the memory element 1804 to electrically connect the memory element 1804 with a bit line 1810. Areas surrounding the memory element 1804 and electrodes 1806, 1808 can be filed with a dielectric isolation layer 1812, such as an oxide or nitride or a combination thereof.

Figure 18:
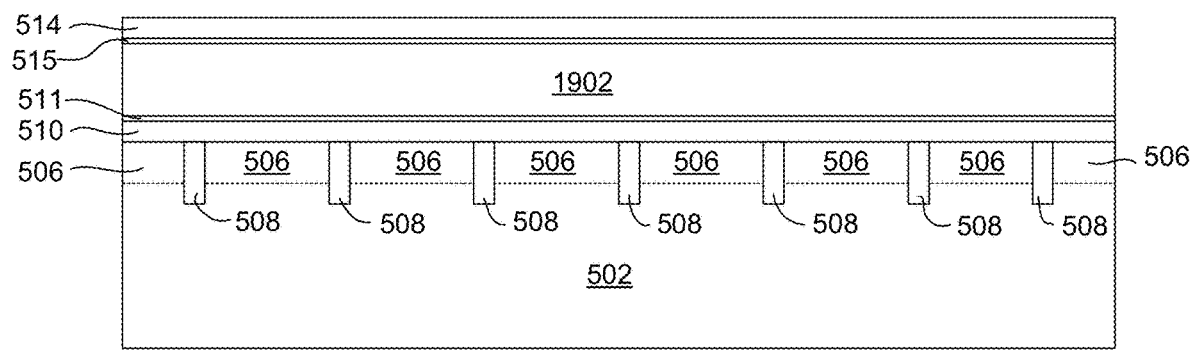
FIG. 18 is a cross sectional view of a memory device in an intermediate stage of manufacture in order to illustrate a method of manufacturing a vertical transistor structure according to an alternate embodiment.

In another method for manufacturing a magnetic memory device, the metal gate layer 512 (preferably tungsten, tungsten nitride or a combination thereof) can be deposited along with the upper and lower dielectric layers, rather than employing a sacrificial layer. For example, as seen in FIG. 18, a first dielectric layer 510, is deposited over the substrate 502/506, followed by a metal gate layer 1902, followed by a second dielectric layer 514. The resulting structure is similar to that described above with regard to FIG. 4, except that sacrificial layer 512 of FIG. 4 is replaced with the electrically conductive metal gate layer 1902, which is deposited along with the dielectric layers 510, 514. TiN layers 511, 515 can be deposited along with the layers 510, 1902, 514 in order to provide protection and enhanced adhesion of the metal word line layer 1902 with the upper and lower dielectric layers 510, 514.

Then, a mask 602 is formed over the second dielectric layer 514, similar to the mask structure described above with reference to FIGS. 5 and 6. Further processing steps for forming the memory device can be similar to those described above with reference to FIGS. 7-17, except that the removal of the sacrificial fill layer 512, and refill with metal as described above with reference to FIGS. 11 through 14 are not necessary, since the metal gate material 1902 has already been deposited along with the dielectric layers 510, 514. In this process, the etching process used to etch through the layers 514, 512, 511 510 such as described above with reference to FIG. 4, would require different etching chemistries, thereby increasing the difficulty of forming the desired openings. However, the difficulty of this change in chemistry is mitigated by the fact that only one set of layers (510, 511, 512, 514) require such etching (as compared with the fabrication of a 3D NAND structure in which many such layers are etched vertically).

Figure 19:
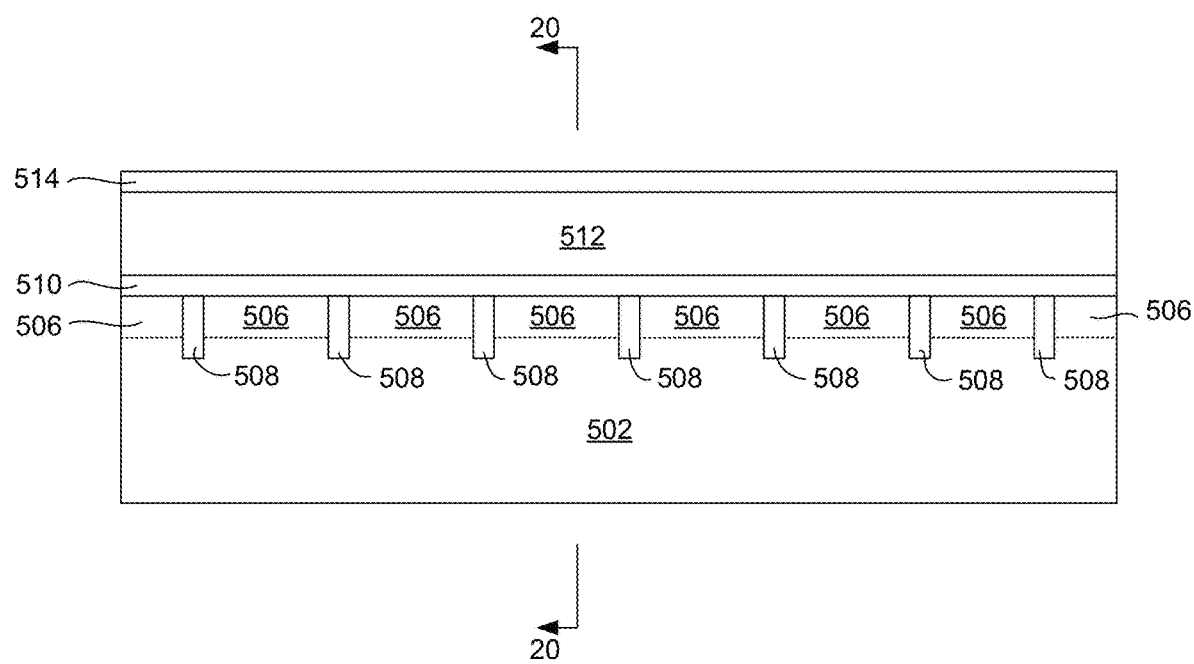
FIGS. 19-22 show a wafer in various intermediate stages of manufacturing in order to illustrate a method for manufacturing a vertical transistor structure according to yet another embodiment.

The above methods described processes wherein the gate dielectric layer is formed prior to the epitaxial growth of the semiconductor pillar structure. However, the use and later removal of a sacrificial layer as described above with reference to FIGS. 4-17 opens up the possibility of another alternate process wherein the semiconductor pillar is formed prior to formation of a gate dielectric layer, and the gate dielectric layer is deposited after removal of the sacrificial layer and prior to the deposition of the metal gate material. Such a process is described herein with reference to FIGS. 19-22. FIG. 19 shows a structure similar to that described above with reference to FIG. 4, wherein: a first dielectric layer 510 is deposited over a doped region 506 of a substrate 502; a sacrificial layer such as SiN is deposited over the first dielectric layer 510; and a second dielectric layer 514 is deposited over the sacrificial layer. The first and second dielectric layers 510, 514 can be an oxide such as SiOx or some other material that is selective to the SiN removal process.

Figure 20:
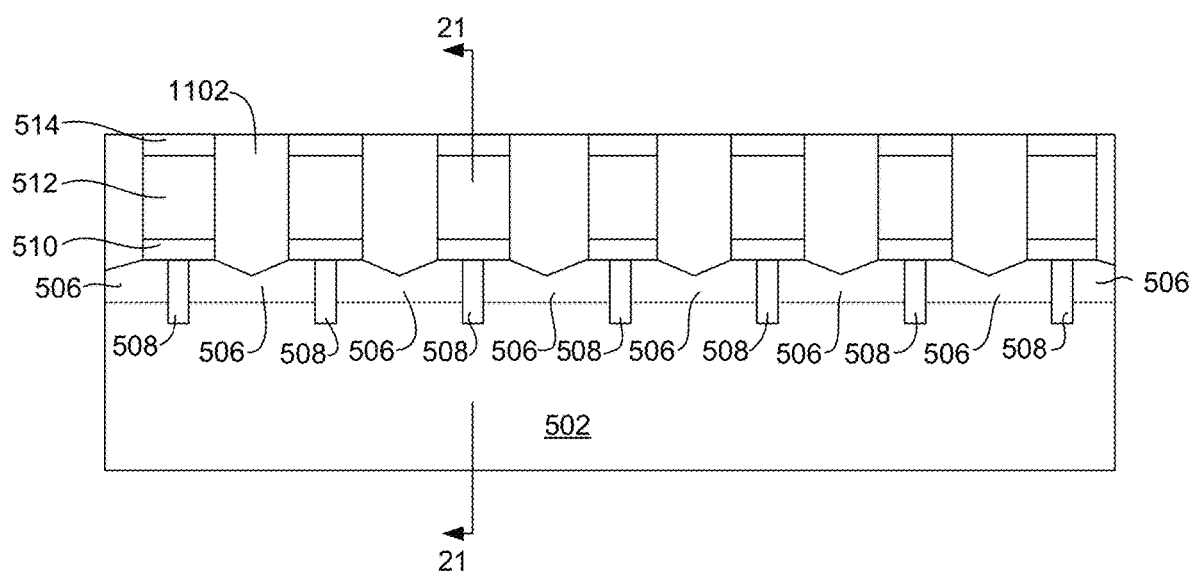
Figure 21:
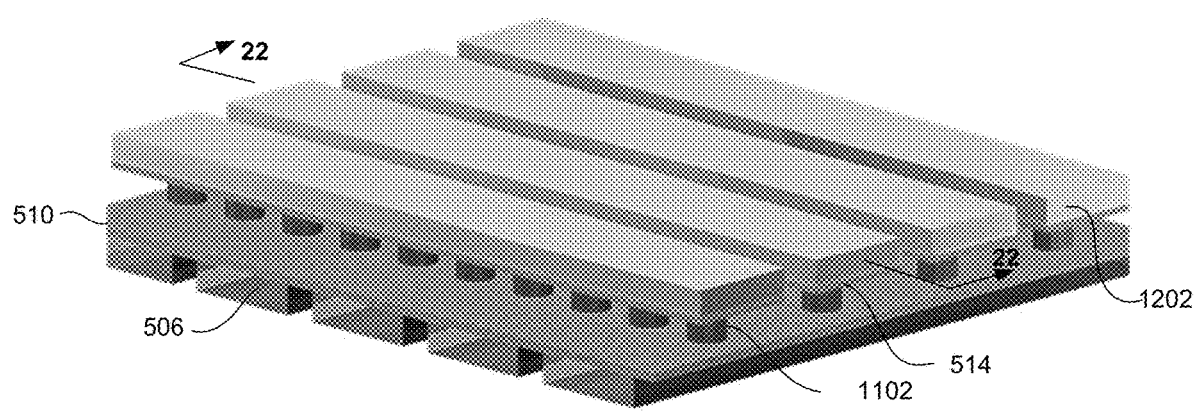

With reference now to FIG. 20, a masking and etching process is performed to form openings in the dielectric layers 510, 514 and sacrificial layer 512 in locations in which semiconductor pillar structures are desired. This etching process can be terminated when the substrate 506 has been reached, and this can be followed by a wet etch process to clean the surface of the substrate 506. Further etching can then be performed to form a desired faceted, crystalline surface in the exposed substrate, such as described above with reference to FIG. 9. Then, semiconductor pillar structures 1102 can be formed by selective epitaxial growth on the faceted surface of the substrate 506 within the openings in the layers 514, 512, 510. As discussed above, the semiconductor pillar structure 1102 can be silicon, silicon-germanium, gallium-arsenide, indium-gallium-arsenide or gallium indium zinc oxide or combinations thereof. The semiconductor pillars 1102 can each be provided with a doped source and drain at lower and upper regions of the semiconductor pillars. As described above, the source and drain formation can be accomplished by implantation during the epitaxial growth of the semiconductor pillars 1102, followed by heat treatment. Alternatively, the source and drain regions can be formed after epitaxial growth of the pillars 1102: the source can be formed by driving the dopants from the doped layer 506 into the bottom part of the pillar 1102 by heat treatment. The drain can be formed by driving dopants from the doped semiconductor layer deposited on top of the wafer followed by heat treatment, as previously described. This option can be followed by an etch-back or polishing process such as chemical mechanical polishing (CMP) to remove the deposited layer or other "mushroomed" material after epitaxial growth from the wafer surface. The obtained structure is shown in FIG. 20. Again, the terms "pillar" and "column" as used herein are not limited to a particular shape but encompass various shapes, such as but not limited to cylindrical pillars or rectangular prisms.

Then, the sacrificial layer 512 can be removed. A hard mask 1202 can be formed and an etching such as reactive ion etching can be performed to remove portions of the upper oxide layer 514 to expose the underlying sacrificial layer 512. The sacrificial layer 512 can then be removed by a wet etching. This can be performed using processes such as described above which can include the use of hot phosphoric acid. A cleaning process can then be performed, such as by the use of HF acid to remove any native oxides from the sides of the semiconductor pillars 1102.

Then, a gate oxide layer can be deposited followed by a protective layer such as Ti/TiN. The gate dielectric layer can be an oxide such as SiOx, which can be deposited by atomic layer deposition (ALD). When depositing the gate dielectric after removal of the sacrificial layer, the gate dielectric can alternatively be formed of an oxide of Hf which advantageously is a high K dielectric material and which also can be deposited by atomic layer deposition or chemical vapor deposition. The protective layer can be a TiN or a combination of Ti and TiN (Ti/TiN) which can be deposited by atomic layer deposition (ALD), physical vapor deposition or a combination thereof.

Figure 22:
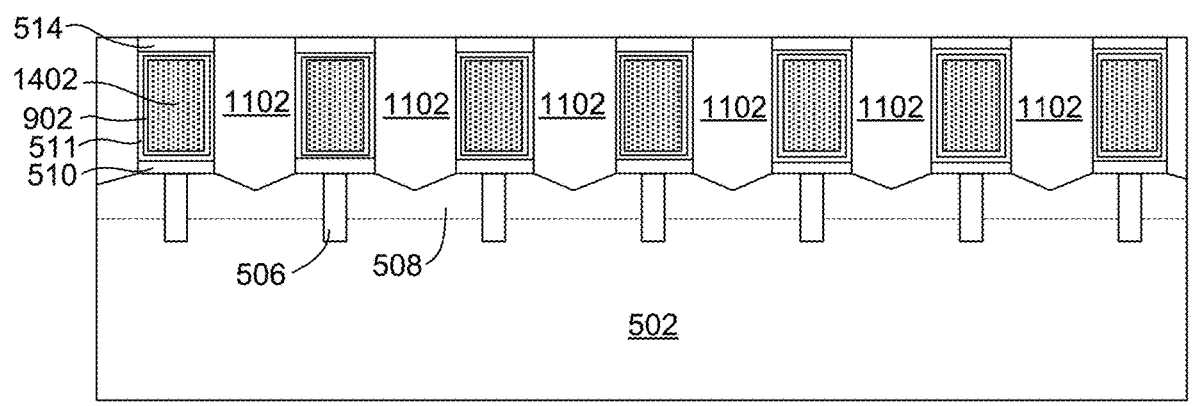

A metal (preferably tungsten (W), tungsten nitride, or a combination thereof) can be deposited. The deposition of the metal can be performed by atomic layer deposition or chemical vapor deposition using a process such as described above or a combination thereof. Then, a polishing process such as chemical mechanical polishing (CMP) can be used to planarize the structure and to remove tungsten and/or Ti/TiN from the surface of the wafer. This results in a structure as shown in FIG. 22, wherein the protective layer (e.g. Ti/TiN) 902 surrounds the metal gate layer 1402, and the gate dielectric layer (e.g. SiOx) 511 surrounds the silicon pillar 1102. The layer 902 protects the gate dielectric layer 511 during the deposition of the metal gate layer 1402, and also promotes good adhesion of the gate dielectric layer 511 with the metal gate layer 1402.

While various embodiments have been described above, it should be understood that they have been presented by way of example only and not limitation. Other embodiments falling within the scope of the invention may also become apparent to those skilled in the art. Thus, the breadth and scope of the inventions should not be limited by any of the above-described exemplary embodiments but should be defined only in accordance with the following claims and their equivalents.

What is claimed is:

1. A method for manufacturing a memory array, the method comprising:
   providing a semiconductor substrate;
   depositing a first dielectric layer over the semiconductor substrate;
   depositing a sacrificial layer over the first dielectric layer;
   depositing a second dielectric layer over the sacrificial layer;
   forming a plurality of vertical semiconductor columns in the sacrificial layer, the plurality of semiconductor columns extending to the substrate having a plurality of corresponding beveled recesses and each semiconductor column including a source and drain;
   removing the sacrificial layer to form an open space adjacent to the semiconductor column;
   depositing a protective and adhesion layer over the open space adjacent to the semiconductor column, the protective and adhesion layer coating the first dielectric layer and the second dielectric layer surrounding the open space; and
   filling the open space with an electrically conductive metal.

2. The method as in claim 1, wherein the sacrificial layer comprises silicon nitride.

3. The method as in claim 1, wherein the electrically conductive metal comprises tungsten.

4. The method as in claim 1, further comprising, before forming the semiconductor columns, forming an opening in the first and second dielectric layers and the sacrificial layer and then depositing a thin gate dielectric layer into the opening.

5. The method as in claim 1, further comprising, after removing the sacrificial layer and before depositing the protective and adhesion layer, depositing a gate dielectric layer.

6. The method as in claim 5, wherein the gate dielectric layer is one or more of silicon oxide and hafnium oxide.

7. The method as in claim 1, wherein the sacrificial layer is removed by wet etch, and the method further comprises, after forming the semiconductor columns and before removing the sacrificial layer, performing a masking and etching process to remove a region of the second dielectric layer to facilitate removal of the sacrificial layer by wet etch.

8. The method as in claim 1, wherein the sacrificial layer is removed by wet etch, and the method further comprises, after forming the semiconductor columns and before removing the sacrificial layer, performing a masking and etching process to remove a portion of the second dielectric layer and the sacrificial layer to facilitate removal of the sacrificial layer by wet etch.

9. The method as in claim 1, further comprising forming a two terminal memory element, the two terminal memory element being electrically connected with the semiconductor column.

10. The method as in claim 1, wherein the protective and adhesion layer comprises TiN.

11. A method for manufacturing a vertical transistor structure, the method comprising:
    providing a substrate;
    depositing a first dielectric layer on the substrate;
    depositing a layer of metal on the first dielectric layer;
    depositing a second dielectric layer on the layer of metal;
    forming an opening in the second dielectric layer, layer of metal and first dielectric layer, the opening extending to the substrate, the opening having a beveled recess extending to the substrate; and
    forming a semiconductor pillar and a surrounding gate dielectric layer into the opening, the semiconductor pillar being formed by selective epitaxial growth and having a source region and a drain region.

12. The method as in claim 11, further comprising, after depositing the first dielectric layer and before depositing the layer of metal, depositing a layer of TiN.

13. The method as in claim 11, wherein the layer of metal comprises tungsten.

14. A memory device comprising:
    semiconductor column formed on a semiconductor substrate;
    a gate dielectric layer surrounding the semiconductor column;
    an electrically conductive metal gate line surrounding the gate dielectric layer and the semiconductor column; and
    a two terminal resistive memory element electrically connected with the semiconductor column,
    wherein the electrically conductive metal gate line is located between first and second dielectric layers, and the memory device further comprises a uniform TiN layer separating the electrically conductive metal gate line from the first and second dielectric layers and the gate dielectric layer.

15. The memory device as in claim 14, wherein the electrically conductive metal gate line comprises tungsten.

16. The memory device as in claim 14, wherein the semiconductor column comprises an epitaxially grown semiconductor.

17. The memory device as in claim 14, wherein the semiconductor column comprises epitaxially grown semiconductor, the epitaxially grown semiconductor comprising one or more of silicon, silicon-germanium, gallium-arsenide, indium-gallium-arsenide or gallium indium zinc oxide.

18. The memory device as in claim 14, further comprising a doped region in the semiconductor substrate, and wherein the semiconductor column is formed on the doped region in the semiconductor substrate.

* * * * *